United States Patent [19]
Lee

[11] Patent Number: 5,874,846
[45] Date of Patent: Feb. 23, 1999

[54] METHOD AND APPARATUS FOR FREQUENCY GENERATION IN A SYNCHRONOUS SYSTEM

[75] Inventor: Wayne Lee, San Jose, Calif.

[73] Assignee: Chrontel Incorporated, San Jose, Calif.

[21] Appl. No.: 785,064

[22] Filed: Jan. 17, 1997

[51] Int. Cl.$^6$ ...................................................... H03K 1/04

[52] U.S. Cl. .......................... 327/299; 327/146; 327/150; 327/151; 327/159; 327/160; 327/241; 327/244

[58] Field of Search ................................... 327/146, 150, 327/151, 159, 160, 241, 244, 299

[56] References Cited

U.S. PATENT DOCUMENTS

| | | | |
|---|---|---|---|
| 4,982,110 | 1/1991 | Yokogawa et al. ...................... | 327/141 |
| 4,985,754 | 1/1991 | Levan ......................................... | 358/23 |
| 5,068,717 | 11/1991 | Jenison ..................................... | 358/17 |
| 5,103,466 | 4/1992 | Bazes ........................................ | 327/98 |
| 5,206,726 | 4/1993 | Okuda ...................................... | 358/149 |
| 5,307,156 | 4/1994 | Yamamoto et al. ....................... | 358/11 |
| 5,455,628 | 10/1995 | Bishop ..................................... | 348/446 |
| 5,526,055 | 6/1996 | Zhang et al. ............................. | 348/510 |
| 5,663,688 | 9/1997 | Delmas et al. ........................... | 327/159 |
| 5,705,945 | 1/1998 | Wee .......................................... | 327/151 |

OTHER PUBLICATIONS

"CH7001 VGA to NTSC/PAL Encoder," Rev. 1.4, Product Literature, Chrontel, Inc., Mar. 26, 1996, pp. 1–20.

Nillesen, "Line–Locked Digital Colour Decoding," Phillips Semiconductors, Jun. 1991, pp. 33–39.

*Primary Examiner*—Margaret Rose Wambach
*Attorney, Agent, or Firm*—Townsend and Townsend and Crew LLP

[57] ABSTRACT

A system is provided for generating an accurate and stable output clock signal of a desired output frequency in response to a system clock signal having a system clock period. The system uses an accurate and stable reference clock signal. The system comprises a measuring circuit and a ratio counter. The measuring circuit receives and processes the system clock signal and produces a measurement, referred to as the system clock measurement, that is indicative of the system clock period. The ratio counter receives the system clock signal and the system clock measurement and generates the output clock signal. The system is resistant to noise in the output clock signal caused by asynchronicity between the system clock signal and the reference clock signal. The system is resistant because it employs at least one of a lock-on unit and a synchronizing controller in operating the clock measuring circuit. The lock-on unit suppresses updating of the system clock measurement if a new measurement differs from the old measurement by no more than a window size. The synchronizing controller assures correct synchronization in the clock measuring circuit despite the asynchronicity of the system clock signal and the reference clock signal by enabling counters within the measuring circuit within a time window of each other.

26 Claims, 9 Drawing Sheets

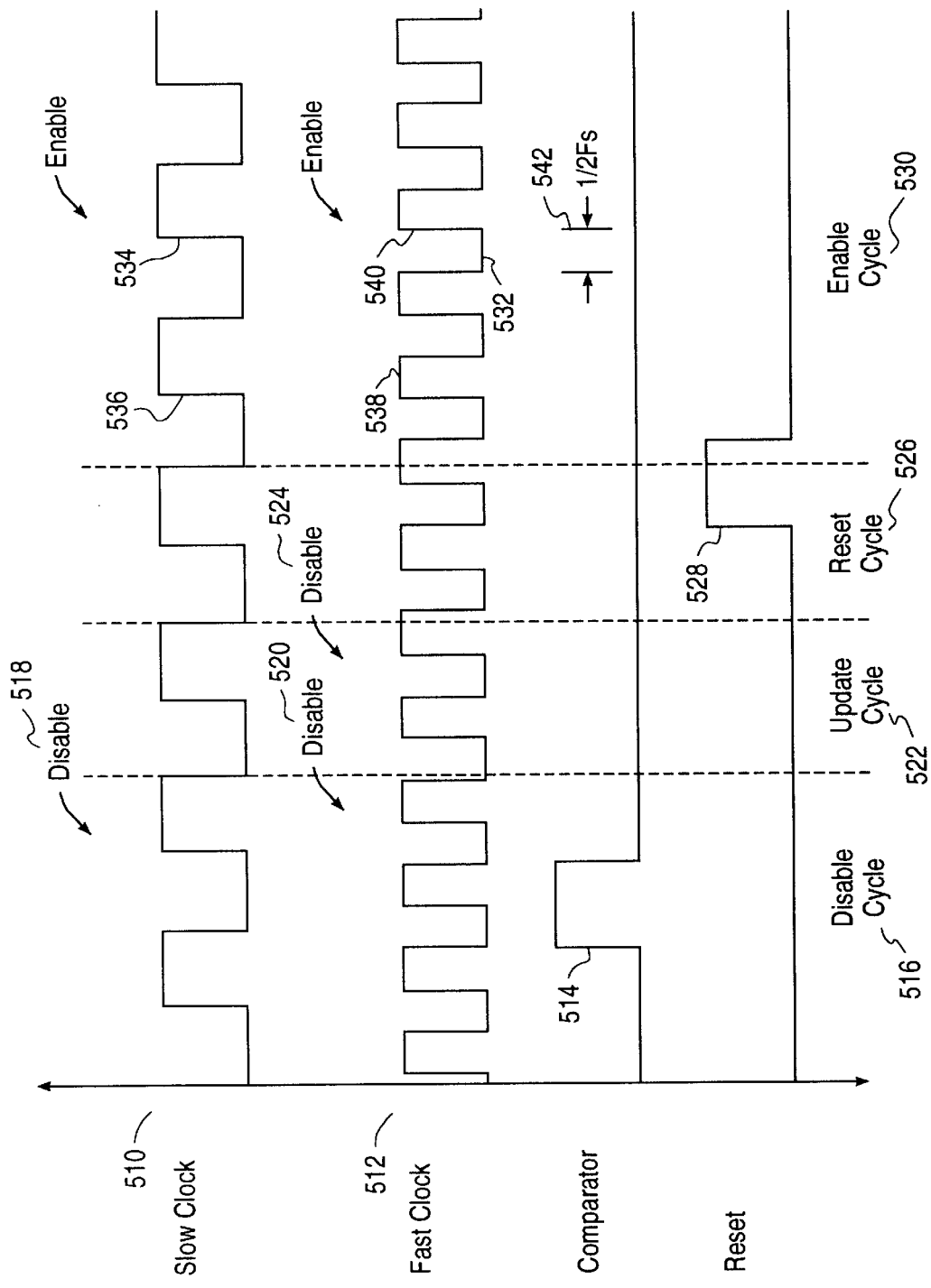

METHOD AND APPARATUS FOR FREQUENCY GENERATION IN A SYNCHRONOUS SYSTEM

BACKGROUND OF THE INVENTION

The invention relates generally to clock circuits and more specifically to circuits for interfacing subsystems having different timing characteristics and tolerances.

In communications systems, such as those for broadcasting, teleconferencing, computer networking, etc., various kinds of modulation techniques are used. Use of these modulation techniques typically requires the availability of precise and accurate modulation frequencies. With the advances of integrated circuit technology, it is increasingly popular for communication systems to apply digital techniques for data/signal processing and data transmission. Therefore, the ability to generate accurate frequencies in synchronous digital systems is essential.

Different modulation standards stipulate greatly different accuracies for modulation frequencies. For example, in telecommunication systems, the frequency of system clocks is typically constrained by international organizations such as CCITT to have errors of no more than 0.01 percent, whereas system clocks of, for example, graphics systems for Personal Computers (PCs) may be in error by as much as 0.25 percent without violating relevant specifications.

With regard to terminology, an "accurate" clock is one that possesses a specified, nominal frequency, and a "stable" clock is one that does not vary in frequency over time, for example, despite temperature fluctuations in a circuit. The terms "accurate" and "stable" will sometimes be used in a relative sense to mean "more nearly accurate" and "more nearly stable," respectively.

There are applications in which a synchronous system with inaccurate clock frequency needs to communicate to another system that requires a predefined accurate and stable signal frequency. An example of such an application is the display of computer graphics onto standard television sets. As mentioned above, in a PC graphics system, the system clock need not be very accurate (system clocks can be off by as much as 0.25 percent). In contrast, a standard television set typically expects a subcarrier frequency that is accurate and stable to better than 100 parts per million (i.e., 0.01 percent). Hence, it is desirable to have a technique that can generate an accurate and stable signal frequency in a system with an inaccurate system clock frequency while maintaining system synchronization. In particular, it is desirable that the generated signal be synchronous with the system clock.

It is apparent that it would be impractical to try to derive any accurate signal frequency directly from an inaccurate system clock. However, if an accurate and stable reference frequency is available, then techniques and systems exist which can derive an accurate and stable frequency based on the reference clock while remaining synchronous with the inaccurate system clock. One such system is found in the "Chrontel CH7001 VGA to NTSC/PAL Encoder" integrated circuit product (CH7001), Chrontel, Inc., San Jose, Calif.

FIG. 1 illustrates at a high level the clock generator of prior art systems similar to the system in the Chrontel CH7001 product. The clock generator includes a clock measuring circuit 10 that produces a system clock measurement Nr 15. The system clock measurement Nr 15 is a digital value, and is provided to a P:Q ratio counter 20 that generates, in response to Nr 15 and a system clock 25, an output clock signal 30 of output frequency Fo. The output frequency Fo is related to the system clock frequency Fs by the equation:

$$Fo = P/Q * Fs \quad (1)$$

wherein Q is a constant parameter of the P:Q ratio counter 20 and:

$$P = Nr \quad (2)$$

As Equation 1 shows, the P:Q ratio counter produces an output clock whose frequency Fo is a function of the system clock frequency Fs and the parameter P, where P is the system clock measurement Nr. The P:Q ratio counter is explained in more detail below in the detailed Description of Specific embodiments.

The clock measuring circuit 10 includes a system counter 35, which receives the system clock signal 25 and counts a predetermined number Ns 40 of transitions therein to delimit a test time period using a timing signal 45. A reference counter 50 receives and counts transitions in an accurate, stable reference clock signal 55 (typically, a crystal-based clock signal) of frequency Fr during the test time period. At the end of the test time period, the output 60 of the reference counter 55 is latched into a buffer 65 to be provided as the system clock measurement Nr 15 to the P:Q ratio counter 20. A controller 70 is coupled to control operation of the system counter 35, the reference counter 50, and the buffer 65. The controller 70 may be coupled (not shown) to receive the system clock signal 25 or the reference clock signal 55, depending on its design.

The relationship between Ns, Nr, Fs, and Fr of the clock measuring circuit 10 is given by:

$$Nr = Ns * Fr/Fs \quad (3)$$

which represents the test time period, Ns*(1/Fs), multiplied by Fr, the number of reference clock periods per second. Combining Equations 1, 2, and 3 gives:

$$\begin{aligned} Fo &= (Ns*Fr/Fs)/Q * Fs \\ &= Ns*Fr/Q \end{aligned} \quad (4)$$

Equation 4 shows that, since Ns, Q, and Fr are well-defined, accurate and stable values, an accurate and stable Fo is generated. Furthermore, a desired Fo can be realized simply by choosing appropriate values of Ns and Q, given Fr. Note that typically, Fr >Fo. Note also that the value of Ns may be switched during operation to cause a new output frequency Fo to be produced by the system, even though the system has but a single reference clock frequency Fr.

Most importantly, the output clock frequency Fo can be realized regardless of the system clock frequency Fs. If the system clock signal is inaccurate but stable, then the system works well. Even if the system clock frequency Fs slowly drifts over time, the clock measuring circuit 10 will update the system clock measurement 15 to maintain a generally correct output frequency Fo (provided that the drift is slow in relation to the test time period).

It is important to note that the system clock measurement Nr 15 should change only in response to actual drifts in the system frequency Fs or to a change in the value of system parameter Ns. Fluctuation in the value of Nr caused by any other reason translates into an undesired shift in the value of the output frequency Fo, and therefore constitutes a type of instability in the output clock signal 30. For example, if within a stream of successive test time periods, the system clock measurement Nr were to fluctuate for one test time period, then, referring to FIG. 2, the actual output clock frequency 200 would also fluctuate by an amount ΔFo 210 for one test time period 220 from the steady, nominal frequency Fo(nom) 230. In consequence, if Fo is used as the modulation signal frequency of a communication system, a fluctuating output clock frequency Fo would be interpreted as "noise" in the receiver.

Unfortunately, Fs and Fr are not synchronous, and there will be some finite but small errors between the counts of the system counter 35 and the reference counter 50. The result of this error will introduce a fluctuation in Nr.

SUMMARY OF THE INVENTION

The present invention provides apparatus and method for deriving an accurate clock frequency from an accurate reference clock in a synchronous system driven by an inaccurate system clock in a way that greatly reduces noise caused by the asynchronicity between the reference clock and the system clock.

A system according to the in invention comprises a measuring circuit and a ratio counter. The measuring circuit receives and processes the system clock signal and produces a measurement, referred to as the system clock measurement, that is indicative of the system clock period. The ratio counter receives the system clock signal and the system clock measurement and generates the output clock signal. In one embodiment of the invention, the system further includes a lock-on unit for inhibiting jitter in the system clock measurement, thereby inhibiting noise in the output clock signal. Rather than always updating the system clock measurement, the lock-on unit receives and compares portions of the system clock measurement and a latest system clock measurement and selectively causes the measuring circuit to update the system clock measurement only if certain jitter-inhibiting criteria are met.

In another embodiment of the invention, the system comprises a system counter, a reference counter, a ratio counter, and a synchronizing controller. The system counter receives the system clock signal and counts a predetermined number of signal transitions therein to delimit a test time period. The reference counter receives a reference clock signal and counts transitions therein during the test time period to produce a measurement, referred to as the system clock measurement, that is indicative of the system clock period. The ratio counter receives the system clock signal and the system clock measurement and generates the output clock signal. The synchronizing controller, in enabling the system counter and the reference counter, enables them within a time window of each other, wherein the time window is half of a clock period of a higher-frequency one of the system clock signal and the reference clock signal. In this way, jitter is inhibited in the system clock measurement, and noise is thereby inhibited in the output clock signal.

In a preferred embodiment of the invention, both a synchronizing controller and a lock-on unit are used. In this embodiment, if the system clock frequency Fs is stable, though perhaps inaccurate, then noise due to the asynchronicity between the system clock and the reference clock will be completely eliminated.

A further understanding of the nature and advantages of the present invention may be realized by reference to the remaining portions of the specification and the drawings.

BRIEF DESCRIPTION OF THE DRAWINGS

FIG. 5A is a timing diagram illustrating the function of the synchronizing controller of FIG. 3;

DESCRIPTION OF SPECIFIC EMBODIMENTS

Figure 3:
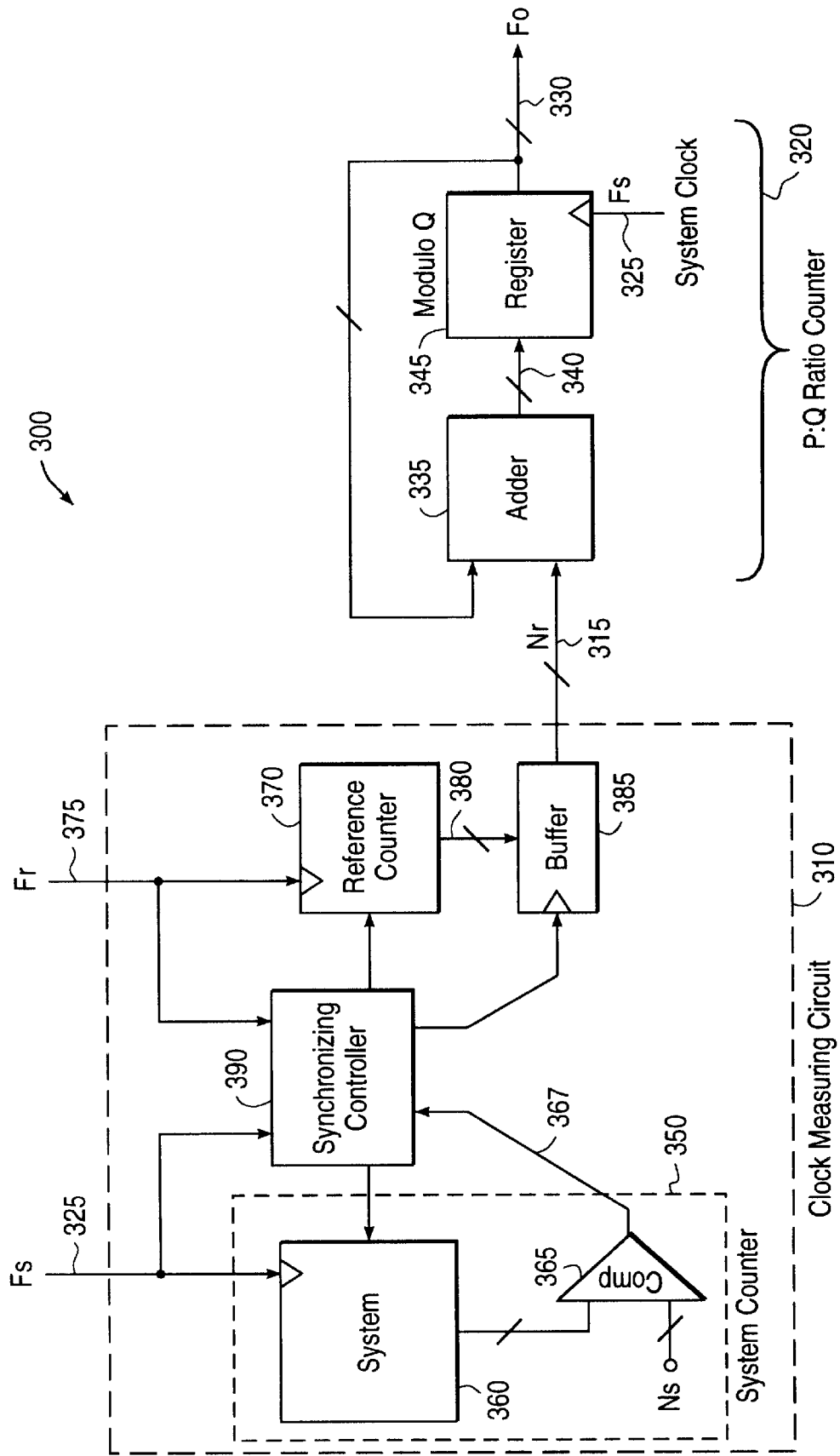
FIG. 3 is a block diagram of one embodiment of the present invention, which embodiment includes a synchronizing controller.

FIG. 3 is a block diagram of a clock generator 300 according to one embodiment of the present invention. The clock generator 300 includes a clock measuring circuit 310 that produces a system clock measurement Nr 315 which is provided to a P:Q ratio counter 320 for use in generating, in response to a system clock 325, an output clock signal 330 of output frequency Fo.

Figure 4:
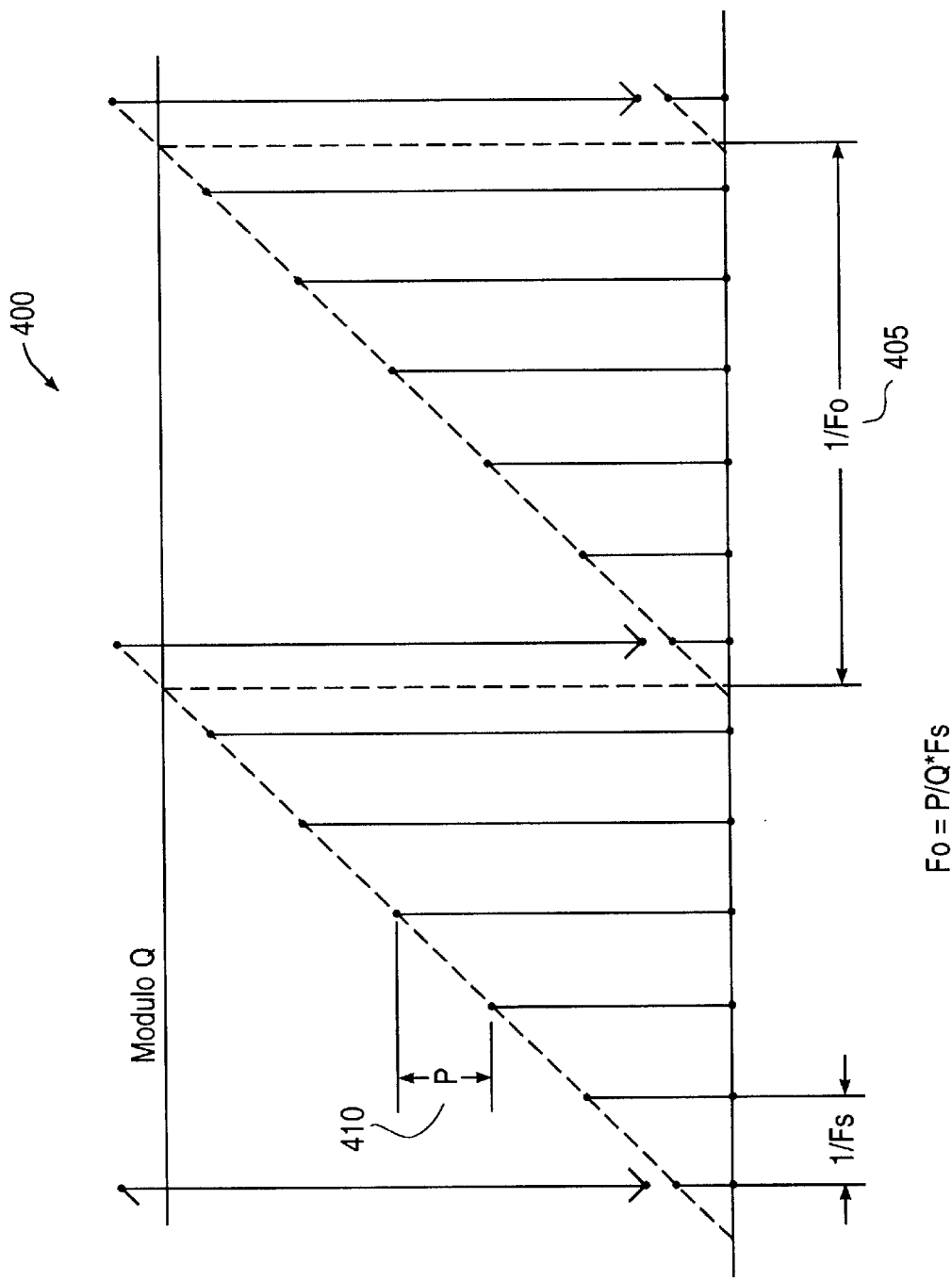
FIG. 4 illustrates the output clock signal generated by a P:Q ratio counter, which is a component of the prior art of FIG. 1 and of the present invention of FIGS. 3 and 6.

The P:Q ratio counter 320 is a circuit known in the art for realizing Equation 1. The implementation shown in FIG. 3 comprises an adder 335 whose multi-bit output 340 is applied to its input through modulo-Q registers 345, which are clocked with the system clock 325. The adder's other input is the multibit system clock measurement Nr 315, also called P. At each system clock period the previous content of the modulo-Q registers 345 is incremented by P until overflow occurs at the value Q. The next value will then be the previous value plus P modulo Q. Therefore, the output clock signal 330 resembles, as shown in FIG. 4, a time discrete quantized sawtooth signal 400 whose period 1/Fo 405 is determined by parameter P 410 according to Equation 1, repeated herein:

$$Fo=P/Q*Fs \qquad (1)$$

Referring to Equation 1, if the system clock were accurate and therefore its frequency Fs known, then constant values for P and Q could simply be chosen by hand to generate a desired output frequency Fo. However, in situations in which the system clock Fs is inaccurate and therefore its frequency not precisely known in advance, circuitry such as the clock measuring circuit 310 of FIG. 3 is used to produce a value for P which is proportional to 1/Fs, the system clock period. As discussed in the Background section, a well-defined and accurate output frequency can thereby be assured, according to Equation 4 (Fo=Ns*Fr/Q), regardless of the actual system clock frequency Fs.

One final note about the P:Q ratio counter is that in a specific application, the contents of modulo-Q register 345 can be used to address a Read Only Memory (ROM) (not shown) containing a predefined wave characteristic, thereby producing a numerical representation of a sampled (at Fs) predefined waveform. Sine and cosine ROMs are exemplary.

Still referring to FIG. 3, the clock measuring circuit 310, as in the prior art, includes a system counter 360 which receives the system clock signal 325 and counts a predetermined number Ns 355 of transitions therein to delimit a test time period. The clock measuring circuit is shown as a digital counter 360 coupled to a digital comparator 365, which produces a timing signal 367 after Ns transitions are counted. However, those of ordinary skill in the art understand that other circuits could be used to implement the same functionality of delimiting the test time period.

A reference counter 370 gives a measurement of the test time period according to an accurate, stable reference clock of frequency Fr. The reference counter 370 of FIG. 3 may be a counter which receives and counts transitions in a reference clock signal 375, which is an oscillating clock signal (e.g., from a crystal oscillator). However, those of ordinary skill in the art understand that there are other circuits for implementing a measurement-giving reference counter. To cite a nonlimiting example, the reference counter 370 may be a subtraction circuit which takes the difference of digital reference clock readings from the end and the start of the test time period, thereby counting the transitions. In any case, at the end of the test time period, the output 380 of the reference counter 370 is provided as the system clock measurement Nr 315 to the P:Q ratio counter 320. In the implementation of FIG. 3, a buffer 385 is used to provide the system clock measurement NR 315. For other implementations of the reference counter, a buffer may be part of the reference counter itself. The clock measurement Nr 315 may be provided to the P:Q ratio counter 320 with all digits at once, or in stages via circuitry such as a multiplexor (not shown). The output of the reference counter may be referred to as the "latest" or the "new" system clock measurement.

Unlike the prior art, the invention shown in FIG. 3 uses a controller which is a synchronizing controller 390, which is coupled to receive the system clock signal 325 and the reference clock signal 375. One way in which the synchronizing controller 390 differs from the prior art is that the synchronizing controller 390 will start the test time period, by enabling the system counter 350 and the reference counter 370, only when the system counter 350 and the reference counter 370 can be started within a certain time window of each other. Starting the two counters closely in time in this way limits spurious differences in the system clock measurement Nr 315 from one test time period to the next. In particular, differences caused by ordinary fluctuation of the phase relationship between the system clock signal 325 and the reference clock signal 375 are limited. The particular way in which the synchronizing controller 390 enables the two counters is described below.

FIG. 5A is a timing diagram illustrating the function of the synchronizing controller of FIG. 3. In FIG. 5A, a "slow clock" signal 510 depicts whichever one of the system clock signal and the reference clock signal has lower frequency. A "fast clock" signal 512 depicts the other, higher-frequency, clock signal. The system counter and the reference counter are individually referred to as the "fast counter" or the "slow counter" based on their corresponding clocks' frequencies. A timing signal 514 indicates the end of a test time period and causes the synchronizing controller to enter a disable cycle 516. During the disable cycle, the synchronizing controller disables the slow counter synchronously 518 (i.e., on an edge) with the slow clock signal and disables the fast counter synchronously 520 with the fast clock signal. Then, the synchronizing controller enters an update cycle 522 in which it updates 524 the system clock measurement with the output of the reference counter. Next, the synchronizing controller enters a reset cycle 526, as indicated in FIG. 5A by a reset signal 528, to reset both fast and slow counters to zero. Because the counters have been disabled, they may be reset asynchronously. Finally, the synchronizing controller enters an enable cycle 530 in which it enables both fast and slow counters according to the algorithm below.

In the enable cycle, prior to which both counters have been disabled, the synchronizing controller first enables the slow counter, but only when the fast clock signal is low 532 and the slow clock signal has a rising edge 534. The synchronizing controller will ignore any earlier rising edge(s) 536 in the slow clock signal which do not have the correct phase relationship with the fast clock—i.e., rising slow-clock edge(s) which occur when the fast clock is high 538. After the slow counter has been enabled, the synchronizing controller will enable the fast counter on the next rising edge of the fast clock signal 540. Therefore, each counter is enabled on its clock's rising edge, and each counter is enabled within ½ Fs time 542 of the other.

The above counter-enabling algorithm results in a maximum time difference of ½ Fs period between the enablement of the two counters and ensures that the two counters 350 and 370 receive clock signal pulses that are of constant widths. In this way, the synchronizing controller prevents timing violations and glitching of the clocks. This is important because, otherwise, timing violation or glitches could cause miscounts which either increase or decrease the proper system or reference counter values, resulting in unstable Fo.

Figure 5B:
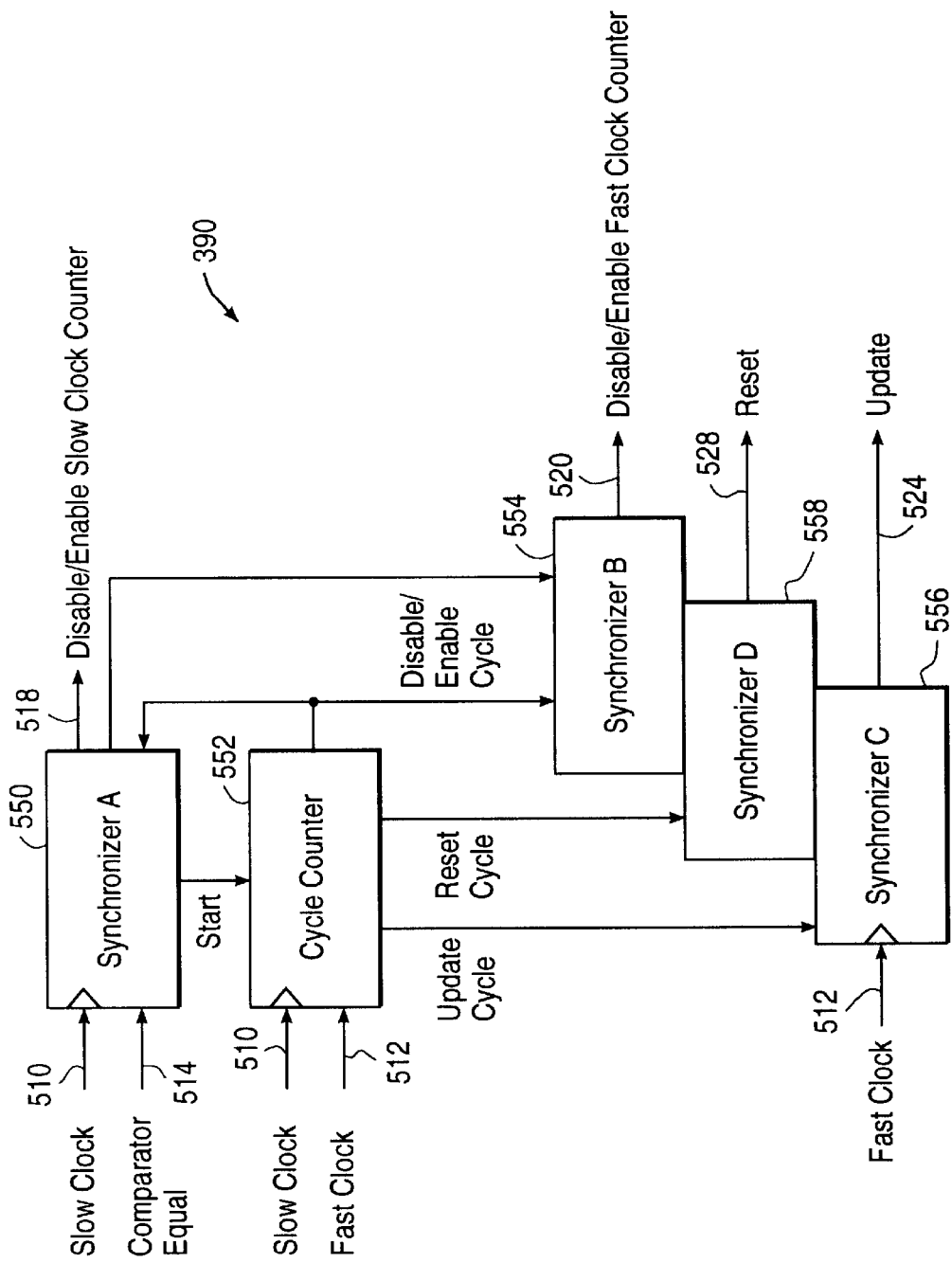
FIG. 5B is a block diagram of an example implementation of the synchronizing controller.

Those of ordinary skill in the art will be able to build the synchronizing controller as described by FIGS. 3 and 5A and the above description. One implementation of the synchronizing controller 390 is depicted in FIG. 5B as a nonlimiting example. A synchronizer circuit A 550 is coupled to receive the timing signal 514 and in response disable the slow counter synchronously 518 with the slow clock signal 510. The synchronizer circuit A 550 next instructs a synchronizer circuit B 554 to disable the fast counter synchronously 520 with the fast clock signal 512. The synchronizer circuit A 550 also enables a cycle counter 552. The cycle counter 552 causes a synchronizer circuit C 556 to update 524 the system clock measurement. The cycle counter 552 next instructs a synchronizer circuit D 558 to reset 528 both fast and slow counters to zero. The cycle counter 552 next waits for the desired phase relationship to arise between the slow clock signal 510 and the fast clock signal 512, as described earlier in connection with FIG. 5A. At the proper time, the cycle counter 552 causes synchronizer circuits A 550 and B 554 to enable the slow and fast counters, respectively.

The synchronizing controller reduces sources of "Nr noise" in the system. Unfortunately, Fs and Fr are not synchronous, and in consequence there will still be some finite but small errors between the counts of the system and reference counters. The result of these errors will introduce a fluctuation in Nr. If the synchronizing controller is employed, Nr will fluctuate at most by one count from its steady-state value during periods when Fs is stable—i.e., not drifting.

Figure 6:
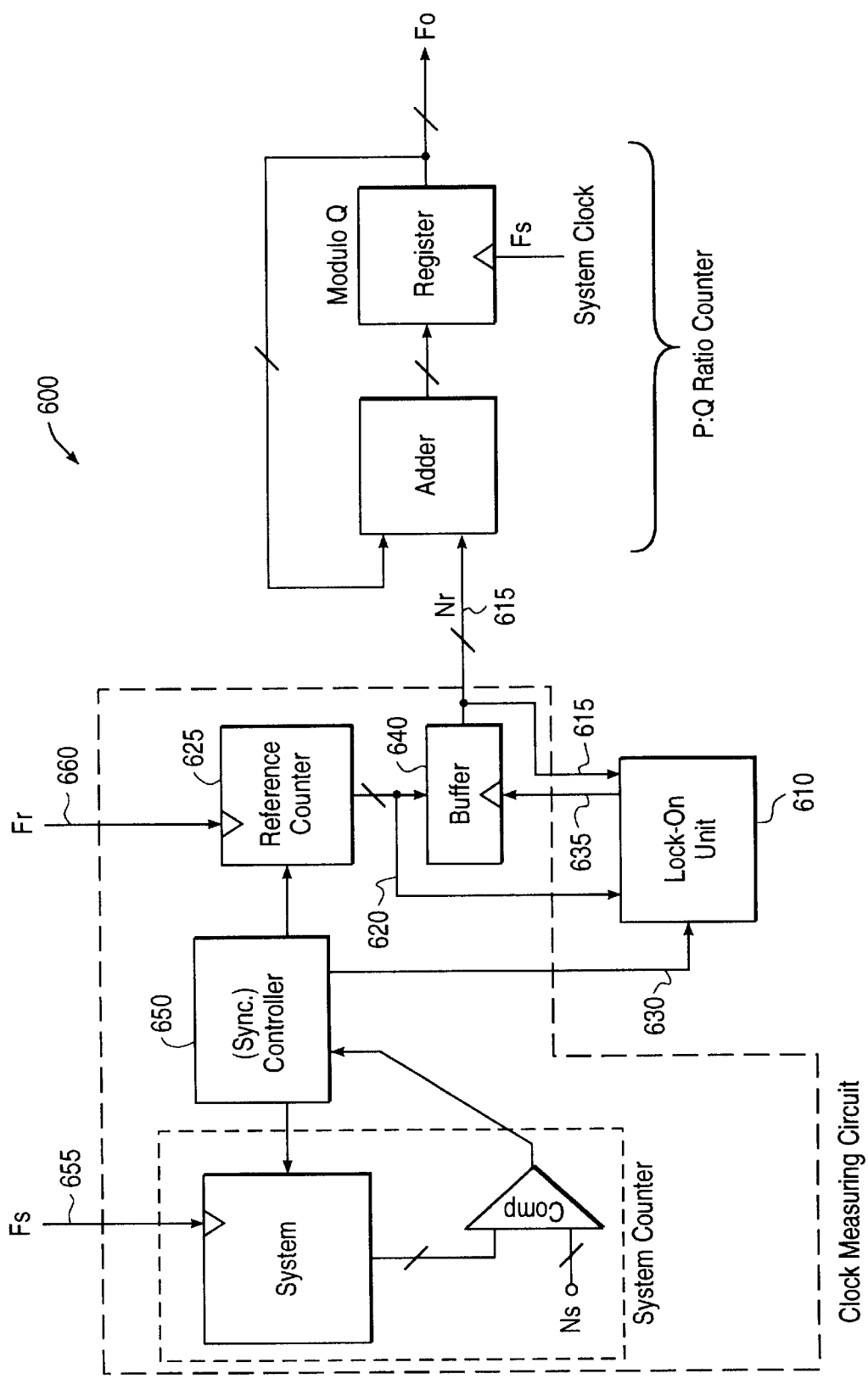
FIG. 6 is a block diagram of a second embodiment of the present invention, which embodiment includes a lock-on unit.

FIG. 6 shows an embodiment 600 of the present invention which includes a lock-on unit 610 that further suppresses "Nr noise." The system of FIG. 6 is substantially similar to the system of FIG. 3, except for the lock-on unit. The lock-on unit suppresses "Nr noise" by introducing a hysteresis in the update of a system clock measurement Nr 615. If, at the end of a test time period, the absolute value of the difference between the content 620 of a reference counter 625 and the system clock measurement Nr 615 is one (1) or less, then the system clock measurement Nr will not be updated and will retain its current value. If the absolute value of the difference is greater than 1, then the lock-on unit 610 generates an update signal 635. If the absolute value of the difference is zero, then it does not matter whether the update signal is generated. In summary, the update signal is suppressed if the absolute value of the difference is no more than a window size, (e.g., one) and no less than a minimum suppression value (e.g., one or zero, depending on whether the update is generated if the difference is zero). Of course, if the minimum suppression value is zero, then the lock-on unit need not actually check the absolute value of the difference (nonnegative) against the minimum suppression value.

Figure 1:
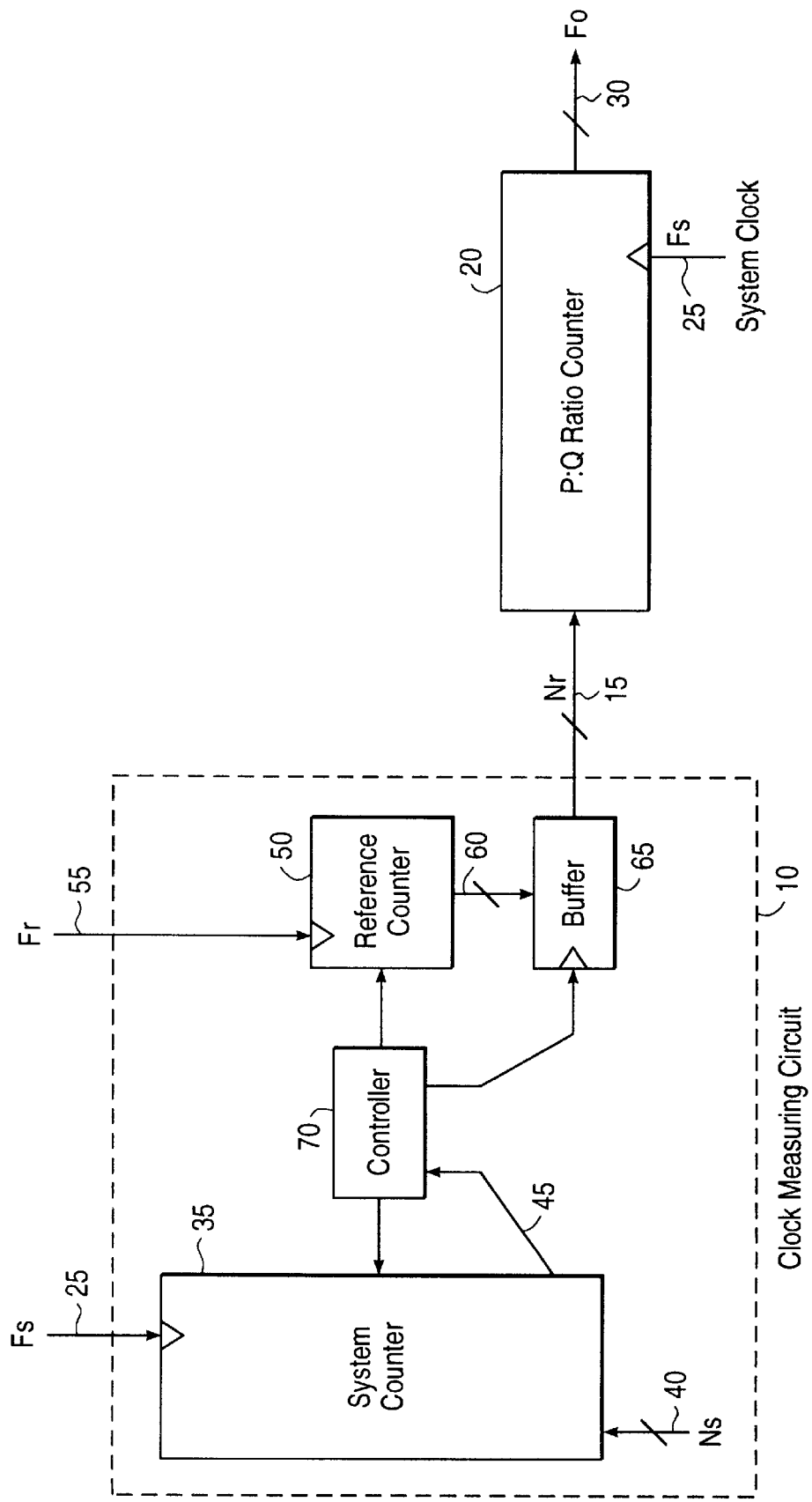
FIG. 1 illustrates a prior art system for producing an output clock signal in a system driven by a system clock.
Figure 2:
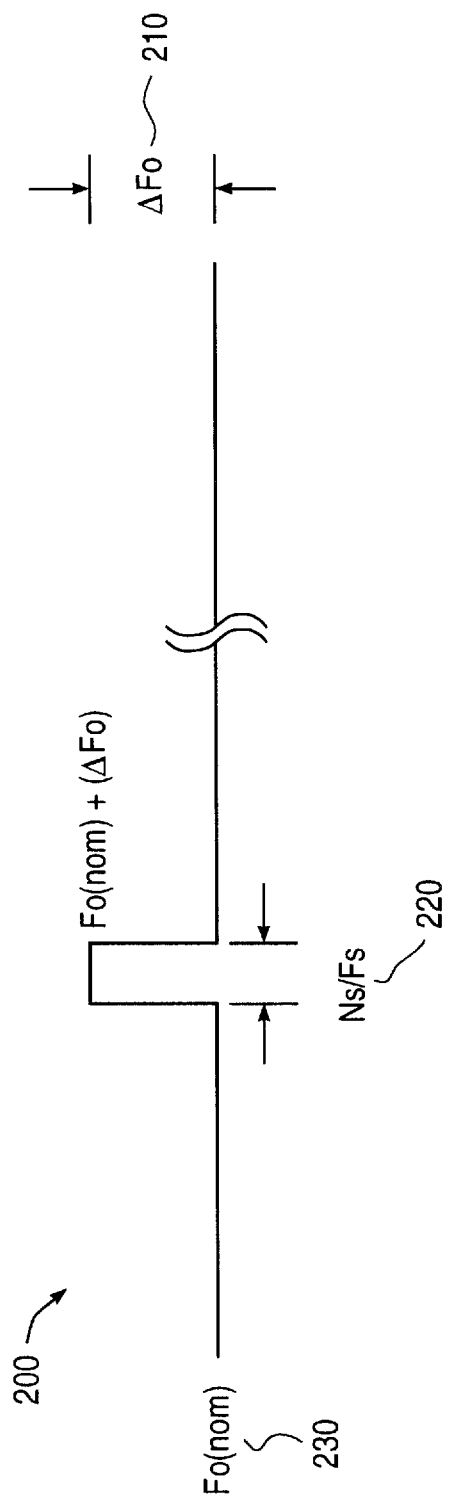
FIG. 2 illustrates noise in an output clock signal caused by a fluctuation in the system clock measurement.

In a preferred embodiment of the present invention, the controller 650 is a synchronizing controller as described above in relation to FIG. 3. Note that if a synchronizing controller is used, then the (synchronizing) controller 650 should be coupled (not shown) to receive the system clock signal 655 and the reference clock signal 660. However, the lock-on unit is useful even with a controller according to the prior art (FIG. 1) which lacks the features of the synchronizing controller.

In applications for which Fs is not only inaccurate, but also fluctuates (e.g., Fs is generated from a phase-locked-loop that is jittery), it is possible that the hysteresis window would need to be set wider, e.g., to a value of two (2) instead of one (1) as discussed above.

Furthermore, by taking advantage of the fact that spurious fluctuations in Nr are bounded to a value of 1 once Nr reaches its "steady-state" value (assuming a synchronizing controller), only a number m of least significant bits of the content of the reference counter 625 and the m least significant bits of the system clock measurement 615 need to be compared. Setting m to be less than the full word length of the reference counter 625 would introduce only a minor penalty in the length of the time required for Nr to reach its steady-state value. In exchange, there could be a significant hardware savings because the word length of the reference counter 625 and the buffer 640 which holds the system clock measurement Nr 615 tends to be quite long in practice (typically 20 bits or longer). Allowing an update to occur if the contents of the two counters are equal will help to reduce the time for Nr to reach its steady-state value. In short, a portion of the content of the reference counter 625 and the system clock measurement 615 are compared, wherein the portion may be all or less than all available bits. In practice, setting m equal to two gives good results. The above hysteresis lock-on technique allows Fo to be not only accurate but also stable without fluctuations.

Figure 7:
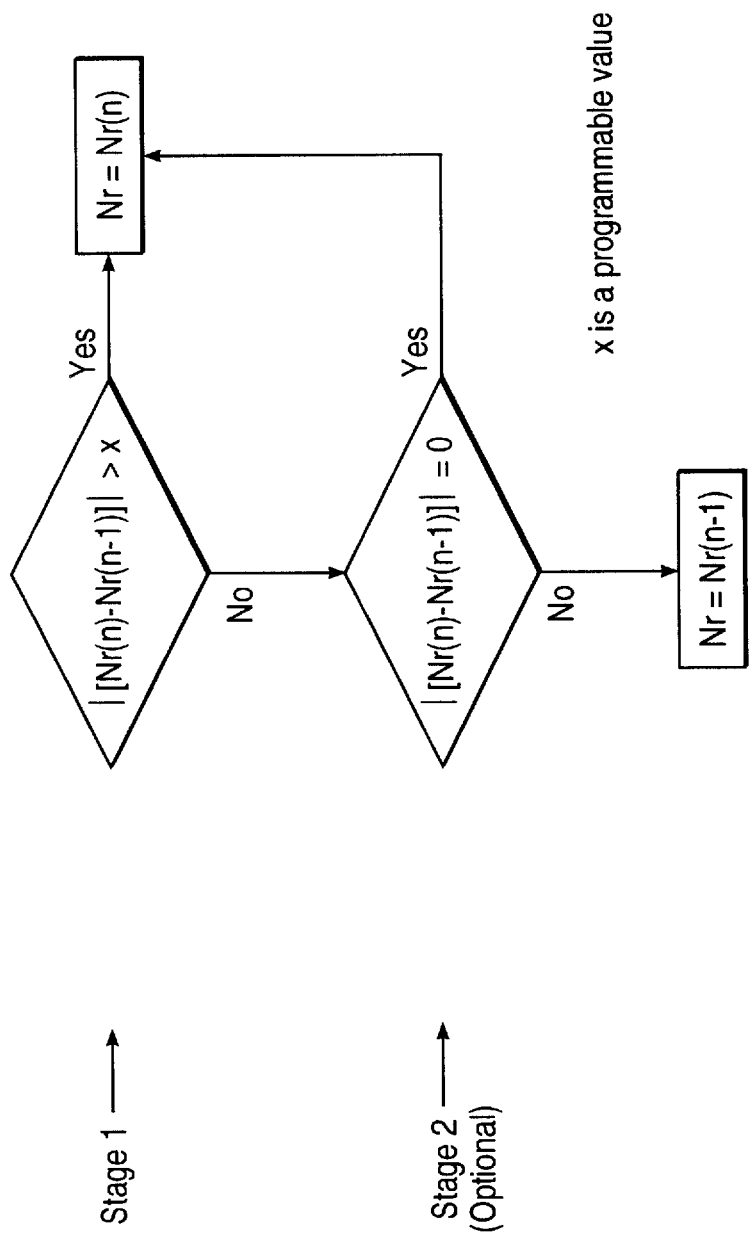
FIG. 7 is a flow chart illustrating the logic implemented in the lock-on unit of FIG. 6.

FIG. 7 is a flowchart which illustrates the lock-on logic described above. Those of ordinary skill in the art will have no trouble building a lock-on unit to implement the above lock-on logic. For example, a lock-on unit might be built using a digital comparator, a buffer to hold the hysteresis window size, and simple control logic. The hysteresis window size could be a programmable parameter, set for example, by a computer program, dip switches, user input, etc.

Figure 8:
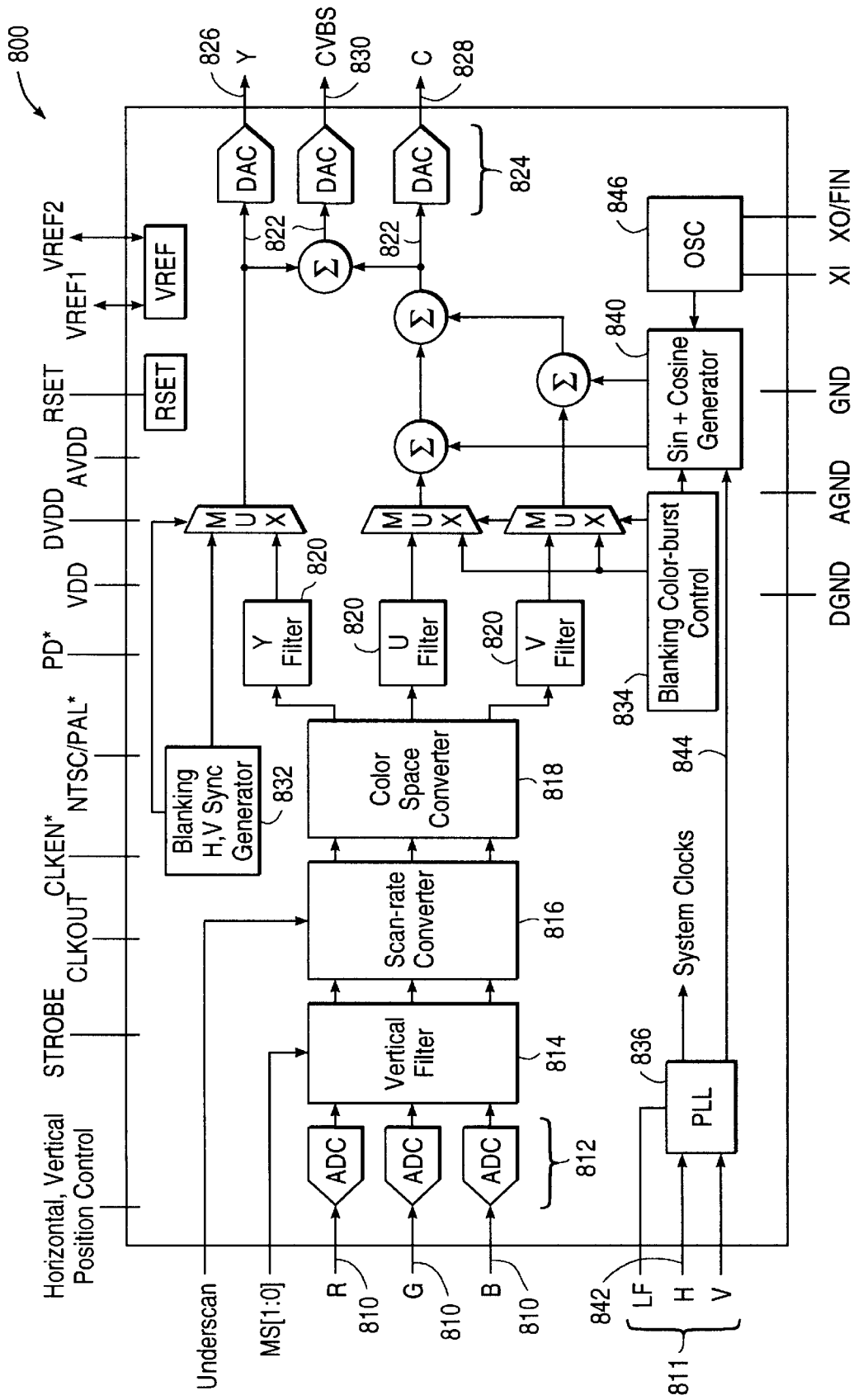
FIG. 8 is a block diagram which illustrates the clock generator as part of a system which converts VGA computer display signals into NTSC or PAL video signals.

FIG. 8 is a block diagram which illustrates the clock generator as part of a system 800 which converts computer video signals into television signals. The depicted system is similar to Chrontel's CH7001 product, and uses the present invention's clock generator. The datasheet "CH7001 VGA to NTSC/PAL Encoder," Rev. 1.4, Mar. 26, 1996, from Chrontel Inc., is hereby incorporated by reference. In FIG. 8, the system 800 accepts analog RGB (Red/Green/Blue) signals 810 and synchronization signals 811 from a standard VGA computer display source, such as a Personal Computer (not shown), and converts them into NTSC or PAL video signals. Three analog-to-digital converters 812 receive and digitize the analog RGB inputs 810 on a pixel-by-pixel basis. A programmable vertical filter 814 then receives the digitized RGB inputs and performs 3-line vertical filtering to eliminate vertical flicker. Next, a scan rate converter 816 transforms the VGA horizontal scan-rate to either NTSC or PAL scan-rates. A color space converter 818 encodes the processed RGB signal into luminance (Y) and color difference (U, V) signals. The resulting YUV signals are filtered through digital filters 820 to minimize aliasing problems. A digital encoder, described below, then receives the filtered signals and transforms them into composite and S-video signals 822. Three digital-to-analog convertors 824 convert the composite and S-video signals 822 into analog outputs Y 826 (luminence), C 828 (chrominance), and composite 830.

The digital encoder comprises a blanking horizontal and vertical synchronizing signal (H/V-sync) generator 832, a blanking color-burst controller 834, a phase-locked loop (PLL) 836, and a sine and cosine generator 840. The H/V-sync generator 832 produces and inserts horizontal and vertical synchronizing signals into the composite and S-video signals 822. The blanking color-burst controller 834 controls the timing of inserting color subcarrier signals into individual lines of the composite and S-video signals 822. The PLL 836 generates system clocks, including a VGA pixel clock which is generated internally, using the horizontal sync input H 842. The sine and cosine generator 840 includes the clock generator described above (not pictured). The clock generator takes as input one system clock signal 844 and produces an output clock signal (not pictured) of an output frequency which is suitable for NTSC or PAL. The output clock signal is then used, as described earlier, to address and thereby sample ROMs containing values of sine and cosine. The sampled sine and cosine values are used to form the subcarrier signals used in encoding the composite and S-video signals 822. The clock generator uses an oscillator 846 to provide a reference clock signal.

Although the foregoing has been a description of the preferred embodiment, this description is intended to be illustrative of the invention, not limiting of it. The scope of the invention is defined by the appended claims.

What is claimed is:

1. A circuit for generating an output clock signal of a desired output frequency in response to a system clock signal having a system clock period, the circuit comprising:

a measuring circuit that receives and processes the system clock signal and produces a measurement, referred to as the latest measurement, that is indicative of the system clock period, the measuring circuit including an output node that provides a measurement, referred to as the system clock measurement, wherein the measuring circuit updates the system clock measurement with the latest measurement in response to an update signal;

a lock-on unit that receives and compares a portion of the latest measurement and a portion of the system clock measurement and responsive to the comparison selectively generates the update signal; and a ratio counter that receives the system clock signal and the system clock measurement and generates the output clock signal.

2. The circuit of claim 1 wherein the lock-on unit suppresses the update signal if the portion of the latest measurement differs from the portion of the system clock measurement by no more than a window size and no less than a minimum suppression value.

3. The circuit of claim 2 wherein the window size equals one.

4. The circuit of claim 2 wherein the window size is a programmable value.

5. The circuit of claim 2 wherein the minimum suppression value equals one.

6. The circuit of claim 1 wherein the lock-on unit generates the update signal only if the portion of the latest measurement differs from the portion of the system clock measurement by more than a window size.

7. The circuit of claim 1 wherein the lock-on unit compares only a lowest m bits of the latest measurement with a lowest m bits of the system clock measurement, wherein m is less than a highest number of bits of the system clock measurement which can be stored by the measuring circuit.

8. The circuit of claim 1 wherein the measuring circuit comprises:
   a system counter to count a predetermined number of transitions in the system clock signal to delimit a test time period; and
   a reference counter to receive and to count transitions in a reference clock signal during the test time period to produce the latest measurement.

9. The circuit of claim 8 wherein the measuring circuit further comprises a synchronizing controller that selectively enables the system counter and the reference counter within a time window of each other.

10. A conversion circuit which includes as a subcircuit the circuit of claim 1, the conversion circuit for converting analog computer video signals into a television video signal, the conversion circuit further comprising:
    analog-to-digital conversion circuitry for converting the analog computer video signals into digital computer video signals;
    a color-space converter that transforms the digital computer video signals into luminance and color difference signals; and
    a digital encoder which uses the output clock signal to generate a subcarrier signal for the television video signal.

11. A circuit for generating an output clock signal of a desired output frequency in response to a system clock signal having a system clock period, the circuit comprising:
    a measuring circuit that receives and processes the system clock signal and a reference clock signal and produces a measurement, referred to as the latest measurement, that is indicative of the system clock period, the measuring circuit including a buffering device that provides a measurement, referred to as the system clock measurement, that is indicative of the system clock period;
    a lock-on unit that selectively provides an update signal if a lowest m bits of the latest measurement differs from a lowest m bits of the system clock measurement by more than a window size, wherein the buffering device updates the system clock measurement in response to the update signal; and
    a ratio counter that receives the system clock signal and the system clock measurement and generates the output clock signal.

12. The circuit of claim 11 wherein the window size is a programmable value.

13. A circuit for generating an output clock signal of a desired output frequency in response to a system clock signal having a system clock period, the circuit comprising:
    a system counter that receives the system clock signal and counts a predetermined number of signal transitions therein to delimit a test time period;
    a reference counter that receives a reference clock signal and counts transitions therein during the test time period to produce a measurement, referred to as the system clock measurement, that is indicative of the system clock period;
    a synchronizing controller, coupled to the system counter and the reference counter, that selectively enables the system counter and the reference counter within a time window of each other; and
    a ratio counter that receives the system clock signal and the system clock measurement and generates the output clock signal.

14. The circuit of claim 13 wherein the time window is half of a clock period of one of the system clock signal and the reference clock signal.

15. The circuit of claim 14 wherein:
    the system clock signal and the reference clock signal are individually referred to as the fast clock signal and the slow clock signal based on their relative frequencies;
    the system counter and the reference counter are individually referred to as the fast counter or the slow counter based on the frequencies of the clock signals whose transitions they count; and
    the synchronizing controller first enables the slow counter and then enables the fast counter.

16. The circuit of claim 15 wherein the synchronizing controller enables the slow counter when the fast clock is in a particular logical state and enables the fast counter when the fast clock leaves the particular logical state.

17. The circuit of claim 16 wherein the synchronizing controller enables the system counter synchronously with the system clock signal and enables the reference counter synchronously with the reference clock signal.

18. The circuit of claim 13 wherein after the end of the test time period the synchronizing controller disables the reference counter synchronously with the reference clock signal.

19. The circuit of claim 13 further comprising:
    a buffer that provides the system clock measurement and in response to an update signal updates the system clock measurement with a new system clock measurement produced by the reference counter; and
    a lock-on unit that receives and compares portions of the system clock measurement and the new system clock measurement to selectively provide the update signal.

20. A method for generating an output clock signal of a desired output frequency in response to a system clock signal having a system clock period, the method comprising the steps of:
    accepting the system clock signal;
    accepting a reference clock signal;
    processing the system clock signal and the reference clock signal to produce a measurement, referred to as the latest measurement, that is indicative of the system clock period;
    providing a system clock measurement;
    making a comparison of a portion of the latest measurement with a portion of the system clock measurement;
    selectively updating the system clock measurement with the latest measurement responsive to the comparison; and
    generating the output clock signal from the system clock signal and the system clock measurement.

21. The method of claim 20 wherein the step of selectively updating the system clock measurement includes the step of suppressing the updating if the portion of the latest measurement differs from the portion of the system clock measurement by no more than a window size and by no less than a minimum suppression value.

22. A method for generating an output clock signal of a desired output frequency in response to a system clock signal having a system clock period, the method comprising the steps of:

enabling a system counter and a reference counter within a time window of each other, wherein the time window is smaller than a clock period of one of the system clock signal and a reference clock signal;

counting, in the system counter, a predetermined number of transitions in the system clock signal to delimit a test time period;

measuring, in the reference counter, a number of transitions in the reference clock signal during the test time period, thereby producing a reference transition count;

providing a system clock measurement indicative of the system clock period from the reference transition count; and generating the output clock signal from the system clock signal and the system clock measurement.

23. The method of claim 22 wherein the step of enabling the system counter and the reference counter comprises the steps of:

enabling a slower counter of the system counter and the reference counter only when a faster clock signal of the system clock signal and the reference clock signal is in a predetermined logical state; and enabling a faster counter of the system counter and the reference counter when the faster clock signal leaves the predetermined logical state.

24. An improved clock-generating circuit of the type having a measuring circuit that provides a system clock measurement of a system clock relative to a reference clock and that updates the system clock measurement in response to an update signal, the type of clock-generating circuit also having a ratio counter that generates an output clock signal of a desired frequency from the system clock and the system clock measurement, wherein the improvement comprises:

a lock-on unit that provides the update signal only if the system clock measurement and a new measurement differ by more than a window size.

25. An improved clock-generating circuit of the type having a system counter that counts transitions in a system clock signal to delimit a test time period, a reference counter that calculates a number of transitions in a reference clock signal during the test time period in producing a system clock measurement, and a ratio counter that receives and processes the system clock and the system clock measurement and generates an output clock signal, wherein the improvement comprises:

a synchronizing controller, coupled to the system counter and the reference counter, that selectively enables the system counter and the reference counter within a time window of each other, wherein the time window is half of a clock period of one of the system clock signal and the reference clock signal.

26. The circuit of claim 25 wherein the synchronizing controller enables the system counter synchronously with the system clock signal and enables the reference counter synchronously with the reference clock signal.

* * * * *